(12) United States Patent
Kang et al.

(10) Patent No.: US 12,178,078 B2
(45) Date of Patent: Dec. 24, 2024

(54) PIXEL AND ELECTRONIC DEVICE

(71) Applicant: Samsung Display Co., Ltd., Yongin-si (KR)

(72) Inventors: Juhoon Kang, Hwaseong-si (KR); Jin-Wook Yang, Suwon-si (KR); Joohee Jeon, Hwaseong-si (KR); Sunmi Kang, Cheonan-si (KR); Gun Hee Kim, Seoul (KR); Hyungkeun Park, Seoul (KR); Seokhyun Lim, Hwaseong-si (KR); Sunyoung Jung, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 401 days.

(21) Appl. No.: 17/745,043

(22) Filed: May 16, 2022

(65) Prior Publication Data

US 2023/0038319 A1 Feb. 9, 2023

(30) Foreign Application Priority Data

Aug. 6, 2021 (KR) ........................ 10-2021-0103951

(51) Int. Cl.
 *H10K 59/121* (2023.01)
 *G09G 3/32* (2016.01)
 (Continued)

(52) U.S. Cl.
 CPC ........... *H10K 59/1213* (2023.02); *G09G 3/32* (2013.01); *G09G 3/3233* (2013.01);
 (Continued)

(58) Field of Classification Search
 CPC ........... H10K 59/1213; H10K 59/1216; H10K 59/131; G09G 3/32; G09G 3/3233;
 (Continued)

(56) References Cited

U.S. PATENT DOCUMENTS 9,324,266 B2 4/2016 Hwang et al.
2015/0371606 A1* 12/2015 Lee .................... G09G 3/3233
 345/82

(Continued)

FOREIGN PATENT DOCUMENTS

| KR | 1020200067584 A | 6/2020 |
| KR | 1020200141854 A | 12/2020 |
| KR | 1020210019635 A | 2/2021 |

*Primary Examiner* — Abhishek Sarma
(74) *Attorney, Agent, or Firm* — CANTOR COLBURN LLP

(57) ABSTRACT

A pixel includes a first capacitor connected between first and second nodes, a second capacitor connected between a first voltage line and the first node, a light emitting diode including a first electrode and a second electrode connected with a second voltage line, a first transistor including a first electrode, a second electrode, and a gate electrode connected with the second node, a second transistor including a first electrode, a second electrode, and a gate electrode which receives a scan signal, a third transistor including a first electrode, a second electrode, and a gate electrode which receives a first compensation scan signal, a fourth transistor including a first electrode, a second electrode, and a gate electrode which receives a second compensation scan signal, and a fifth transistor including a first electrode, a second electrode, and a gate electrode which receives a first light emitting signal.

20 Claims, 13 Drawing Sheets

(51) Int. Cl.
*G09G 3/3233* (2016.01)
*H10K 59/131* (2023.01)

(52) U.S. Cl.
CPC ....... *H10K 59/1216* (2023.02); *H10K 59/131* (2023.02); *G09G 2300/0819* (2013.01); *G09G 2300/0852* (2013.01); *G09G 2300/0861* (2013.01); *G09G 2310/0262* (2013.01); *G09G 2320/043* (2013.01); *G09G 2340/0435* (2013.01)

(58) Field of Classification Search
CPC ... G09G 2300/0819; G09G 2300/0852; G09G 2300/0861; G09G 2310/0262; G09G 2320/043; G09G 2340/0435; G09G 3/3266; G09G 2310/0251; G09G 3/3225; G09G 2300/0426
See application file for complete search history.

(56) References Cited

U.S. PATENT DOCUMENTS

| | | | |
|---|---|---|---|
| 2021/0049965 A1 | 2/2021 | Jeon et al. | |
| 2022/0044634 A1* | 2/2022 | Ka | G09G 3/3258 |

* cited by examiner

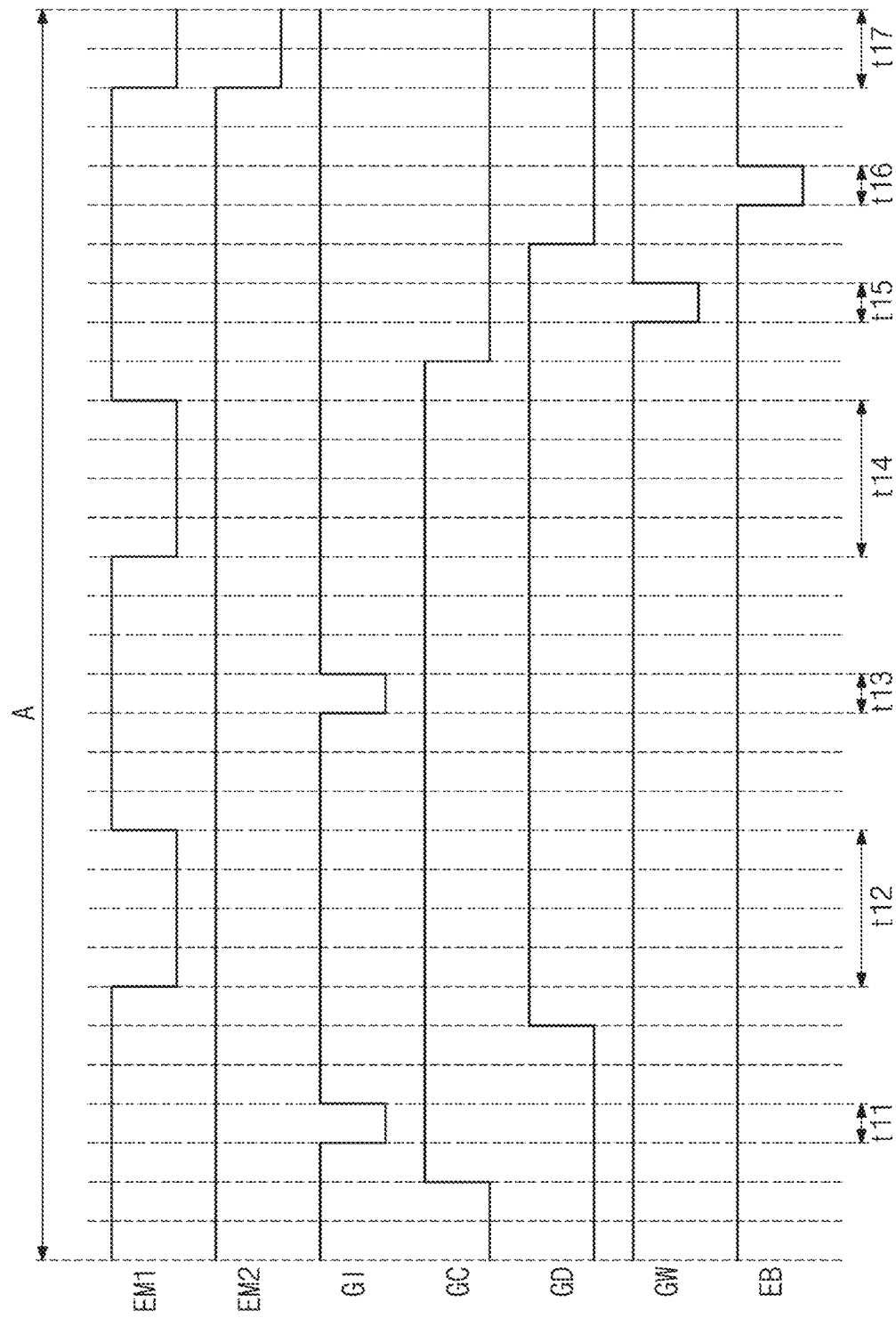

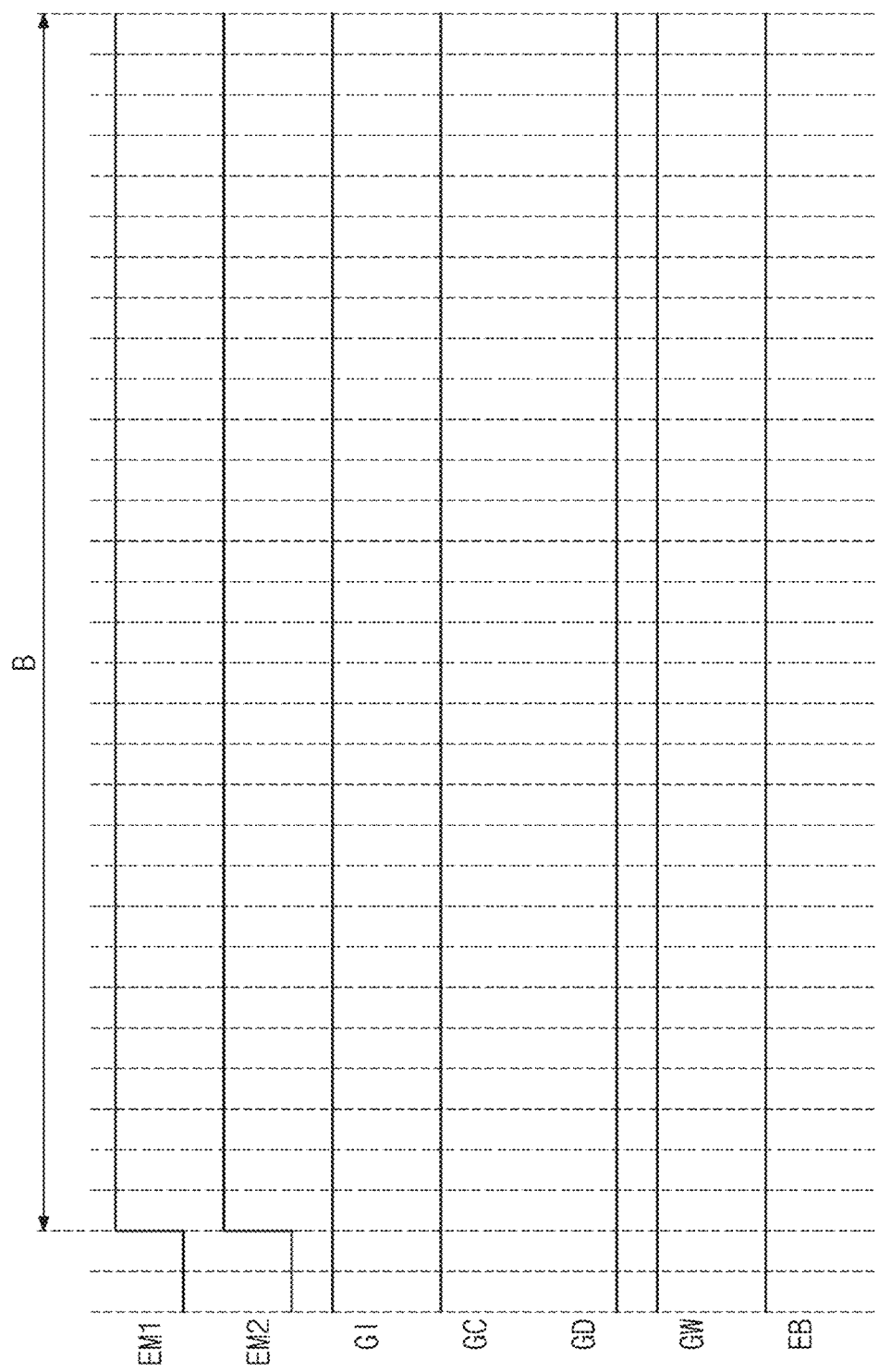

PIXEL AND ELECTRONIC DEVICE

This application claims priority to Korean Patent Application No. 10-2021-0103951, filed on Aug. 6, 2021, and all the benefits accruing therefrom under 35 U.S.C. § 119, the content of which in its entirety is herein incorporated by reference.

BACKGROUND

1. Field

Embodiments of the disclosure described herein relate to a pixel and an electronic device, which have improved display quality.

2. Description of the Related Art

An electronic device may be a device including various electronic components such as a display panel for displaying an image, an input sensor for sensing an external input, and an electronic module. The electronic components may be connected with each other by signal lines variously arranged. The display panel includes a plurality of pixels. Each of the plurality of pixels may include a light emitting element for generating light and a pixel circuit part for controlling the amount of current which flows to the light emitting element. When a leakage current is generated in the circuit part in the pixel, display quality may be degraded due to a change in the amount of current which flows through the light emitting element.

SUMMARY

Embodiments of the disclosure provide a pixel and an electronic device, which have improved display quality.

According to an embodiment, a pixel includes a first capacitor connected between a first node and a second node, a second capacitor connected between a first voltage line which supplies a first driving voltage and the first node, a light emitting diode including a first electrode and a second electrode connected with a second voltage line which supplies a second driving voltage, a first transistor including a first electrode connected with the first voltage line, a second electrode connected with the first electrode of the light emitting diode, and a gate electrode connected with the second node, a second transistor including a first electrode connected with a data line, a second electrode connected with the first node, and a gate electrode which receives a scan signal, a third transistor including a first electrode connected with the second node, a second electrode connected with a first initialization voltage line which supplies a first initialization voltage, and a gate electrode which receives a first compensation scan signal, a fourth transistor including a first electrode connected with the second electrode of the second transistor, a second electrode connected with the first node, and a gate electrode which receives a second compensation scan signal, and a fifth transistor including a first electrode, a second electrode connected with each of the second electrode of the second transistor and the first electrode of the fourth transistor, and a gate electrode which receives a first light emitting signal.

In an embodiment, the third transistor and the fourth transistor may include an oxide semiconductor.

In an embodiment, the first electrode of the fifth transistor may be connected with the first voltage line.

In an embodiment, the first electrode of the fifth transistor may be connected with a reference voltage line which supplies a reference voltage.

In an embodiment, the pixel may further include a sixth transistor including a first electrode connected with the first voltage line, a second electrode connected with the first electrode of the first transistor, and a gate electrode which receives the first light emitting signal, a seventh transistor including a first electrode connected with the second electrode of the third transistor, a second electrode connected with the first initialization voltage line, and a gate electrode which receives an initialization scan signal, and an eighth transistor including a first electrode connected with the first electrode of the light emitting diode, a second electrode connected with the second electrode of the first transistor, and a gate electrode which receives a second light emitting signal.

In an embodiment, the pixel may further include a ninth transistor including a first electrode connected with the first electrode of the first transistor, a second electrode connected with a bias voltage line which supplies a bias voltage, and a gate electrode which receives the scan signal.

In an embodiment, the pixel may further include a tenth transistor including a first electrode, a second electrode connected with the first electrode of the light emitting diode, and a gate electrode which receives the scan signal.

In an embodiment, the first electrode of the tenth transistor may be connected with a second initialization voltage line which supplies a second initialization voltage. In such an embodiment, the first initialization voltage may have a voltage level higher than the second initialization voltage.

In an embodiment, the first electrode of the tenth transistor may be connected to the first electrode of the seventh transistor.

In an embodiment, the pixel may further include a first scan line and a second scan line. In such an embodiment, the scan signal may include a first scan signal provided through the first scan line and a second scan signal provided through the second scan line.

In an embodiment, the first scan signal may be provided to the gate electrode of the second transistor, and the second scan signal may be provided to the gate electrode of the eighth transistor and the gate electrode of the ninth transistor.

In an embodiment, the initialization scan signal and the first compensation scan signal may be in an active level during a first interval.

In an embodiment, the first light emitting signal, the first compensation scan signal, and the second compensation scan signal may be in an active level during a second interval subsequent to the first interval.

In an embodiment, the initialization scan signal, the first compensation scan signal, and the second compensation scan signal may be in an active level during a third interval subsequent to the second interval.

In an embodiment, the first light emitting signal, the first compensation scan signal, and the second compensation scan signal may be in an active level during a fourth interval subsequent to the third interval.

In an embodiment, the second compensation scan signal and the first scan signal may be in an active level during a fifth interval subsequent to the fourth interval.

In an embodiment, the second scan signal may be in an active level during a sixth interval subsequent to the fifth interval.

In an embodiment, the first light emitting signal and the second light emitting signal may be in the active level during a seventh interval subsequent to the sixth interval. In such an embodiment, one frame may include a driving interval and at least one scan interval, and the driving interval may include the first to seventh intervals.

According to an embodiment, an electronic device includes a display panel including a plurality of pixels. In such an embodiment, each of the plurality of pixels includes a first capacitor connected between a first node and a second node, a second capacitor connected between a first voltage line which supplies a first driving voltage and the first node, a light emitting diode including a first electrode and a second electrode connected with a second voltage line which supplies a second driving voltage, a first transistor including a first electrode connected with the first voltage line, a second electrode connected with the first electrode of the light emitting diode, and a gate electrode connected with the second node, a second transistor including a first electrode connected with a data line, a second electrode connected with the first node, and a gate electrode which receives a scan signal, a third transistor including a first electrode connected with the second node, a second electrode connected with a first initialization voltage line which supplies a first initialization voltage, and a gate electrode which receives a first compensation scan signal, a fourth transistor including a first electrode connected with the second electrode of the second transistor, a second electrode connected with the first node, and a gate electrode which receives a second compensation scan signal, and a fifth transistor including a first electrode connected with the first voltage line, a second electrode connected with each of the second electrode of the second transistor and the first electrode of the fourth transistor, and a gate electrode which receives a first light emitting signal. In such an embodiment, the third transistor and the fourth transistor may be N-type transistors, and the first transistor, the second transistor and the fifth transistor may be P-type transistors.

In an embodiment, the electronic device may further include a sixth transistor including a first electrode connected with the first electrode of the first transistor, a second electrode connected with a bias voltage line which supplies a bias voltage, and a gate electrode which receives the scan signal, and a seventh transistor including a first electrode connected with a second initialization voltage line which supplies a second initialization voltage, a second electrode connected with the first electrode of the light emitting diode, and a gate electrode which receives the scan signal.

BRIEF DESCRIPTION OF THE DRAWINGS

The above and other features of the disclosure will become apparent by describing in detail embodiments thereof with reference to the accompanying drawings, in which:

FIGS. 5A and 5B are signal timing diagrams of driving signals according to an embodiment of the disclosure;

DETAILED DESCRIPTION

Figure 1:
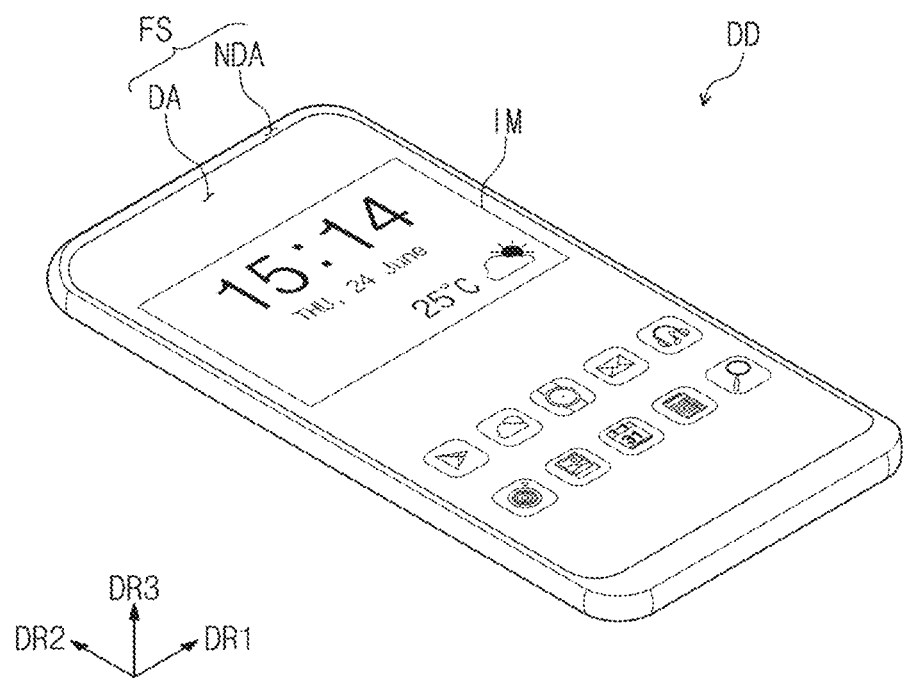
FIG. 1 is a perspective view of an electronic device according to an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In the specification, the expression that a first component (or region, layer, part, portion, etc.) is "on", "connected with", or "coupled with" a second component means that the first component is directly on, connected with, or coupled with the second component or means that a third component is interposed therebetween. In contrast, when an element is referred to as being "directly on" another element, there are no intervening elements present.

The same reference numerals refer to the same components. Also, in the drawings, the thicknesses, the ratios, and the dimensions of the elements may be exaggerated for effective description of technical contents. The expression "and/or" includes one or more combinations which associated components are capable of defining.

Although the terms "first," "second," etc. may be used herein in describing various elements, such elements should not be construed as being limited by these terms. These terms are only used to distinguish one element from another element. For example, a first element could be termed a second element without departing from the scope of the claims of the disclosure, and similarly a second element could be termed a first element. The singular forms are intended to include the plural forms unless the context clearly indicates otherwise.

Also, the terms "under", "below", "on", "above", etc. are used to describe the correlation of components illustrated in drawings. The terms that are relative in concept are described based on a direction shown in drawings.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical terms and scientific terms) used in the specification have the same meaning as commonly understood by one skilled in the art to which the disclosure belongs. Furthermore, terms such as terms defined in the dictionaries commonly used should be interpreted as having a meaning consistent with the meaning in the context of the related technology, and should not be interpreted in ideal or overly formal meanings unless explicitly defined herein.

Hereinafter, embodiments of the disclosure will be described in detail with reference to the accompanying drawings.

FIG. 1 is a perspective view of an electronic device according to an embodiment of the disclosure.

Referring to FIG. 1, an embodiment of an electronic device DD has a shape having a short edge in a first direction DR1 and a long edge in a second direction DR2 intersecting the first direction DR1. However, the shape of the electronic device DD is not limited thereto, and may be provided in various shapes.

An embodiment of the electronic device DD may be a small and medium-sized electronic device, such as a mobile phone, a tablet, a vehicle navigation system, or a game console, as well as a large-sized electronic device, such as a television or a monitor. Alternatively, the electronic device DD may be applied to another type of electronic device, without departing from the teachings herein.

In an embodiment, as shown in FIG. 1, the electronic device DD may display an image IM toward a third direction DR3 perpendicular to the first direction DR1 and the second direction DR2 on a display surface FS parallel to each of the first direction DR1 and the second direction DR2. The third direction DR3 may be a thickness direction of the electronic device DD. The display surface FS on which the image IM is displayed may correspond to a front surface of the electronic device DD.

The display surface FS of the electronic device DD may be divided into a plurality of areas. A display area DA and a non-display area NDA may be defined in the display surface FS of the electronic device DD.

The display area DA may be an area on which the image IM is displayed, and a user may view the image IM displayed on the display area DA. In an embodiment, a shape of the display area DA may be defined substantially by the non-display area NDA, for example, but not being limited thereto. Alternatively, the non-display area NDA may be disposed adjacent to only one side of the display area DA or may be omitted. Embodiments of the electronic device DD may be variously modified and is not limited to any one embodiment.

The non-display area NDA may be an area adjacent to the display area DA, which may be an area on which the image IM is not displayed. A bezel area of the electronic device DD may be defined by the non-display area NDA.

In an embodiment, the non-display area NDA may surround the display area DA, for example, but not being limited thereto. Alternatively, the non-display area NDA may be adjacent to only a portion of the edge of the display area DA, and is not limited to any one embodiment.

Figure 2:
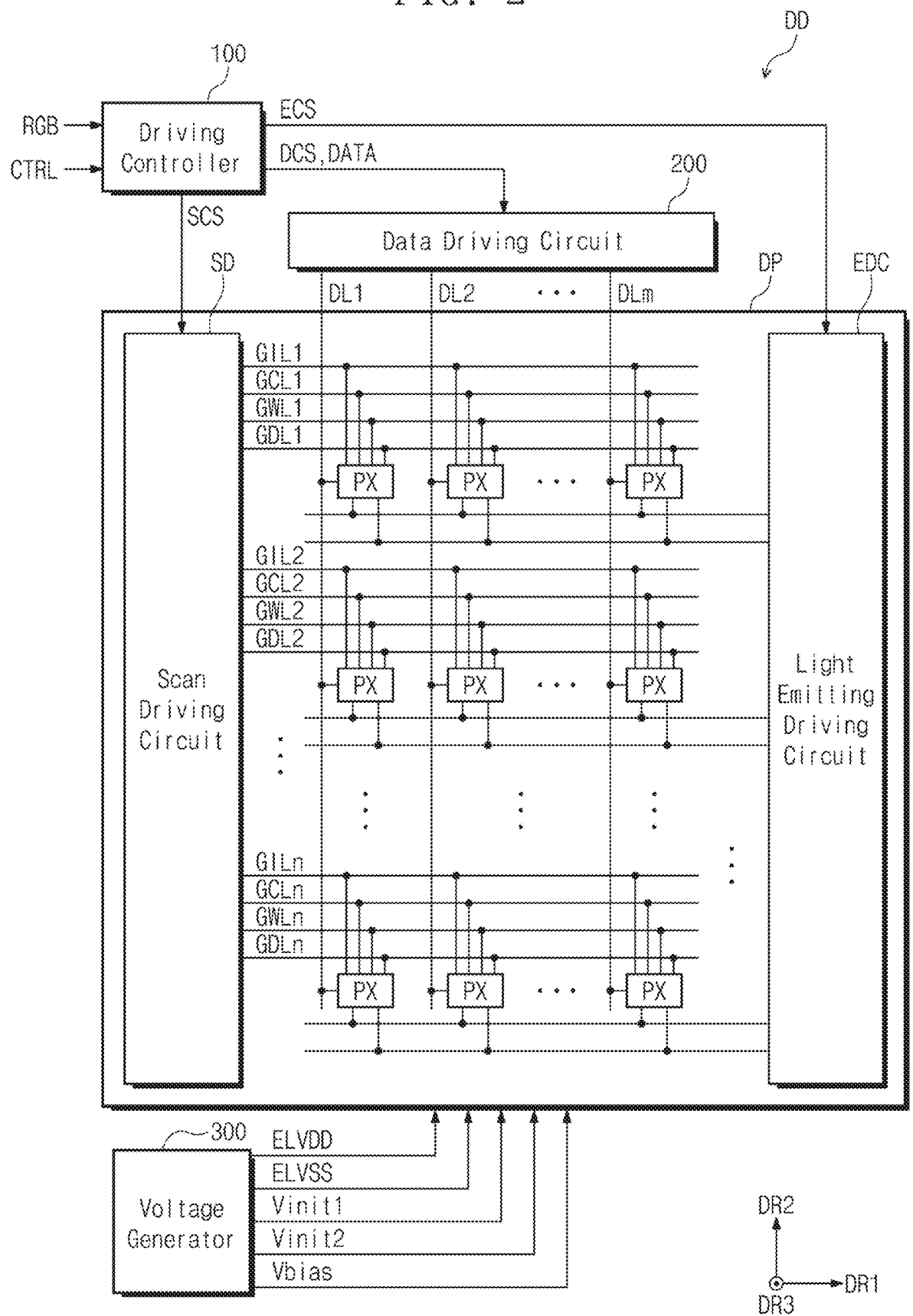
FIG. 2 is a block diagram of the electronic device according to an embodiment of the disclosure.

FIG. 2 is a block diagram of the electronic device according to an embodiment of the disclosure.

Referring to FIG. 2, an embodiment of an electronic device DD may include a display panel DP, a driving controller 100, a data driving circuit 200, and a voltage generator 300.

An embodiment of the display panel DP according to the disclosure may be a light emitting display panel, for example, but not being limited thereto. In an embodiment, for example, the display panel DP may be an organic light emitting display panel, a quantum dot light emitting display panel, a micro-light emitting diode ("LED") display panel, or a nano-LED display panel. A light emitting layer of the organic light emitting display panel may include an organic light emitting material. A light emitting layer of the quantum dot light emitting display panel may include a quantum dot, a quantum rod, and the like. A light emitting layer of the micro-LED display panel may include a micro-LED. A light emitting layer of the nano-LED display layer may include a nano-LED.

The driving controller 100 may receive an image signal RGB and a control signal CTRL. The driving controller 100 may generate an image data signal DATA into which a data format of the image signal RGB is converted to match interface specifications with the data driving circuit 200. The driving controller 100 outputs a scan control signal SCS, a data control signal DCS, and a light emitting driving control signal ECS.

The data driving circuit 200 may receive the data control signal DCS and the image data signal DATA from the driving controller 100. The data driving circuit 200 may convert the data image signal DATA into data signals Vdata (refer to FIG. 3) and may output the data signals Vdata (refer to FIG. 3) to a plurality of data lines DL1-DLm, respectively. The data signals Vdata (refer to FIG. 3) may be analog voltages corresponding to a gray scale value of the image data signal DATA.

In an embodiment, the data driving circuit 200 may output the data signals Vdata (refer to FIG. 3) corresponding to the image data signal DATA to the data lines DL1-DLm, respectively, during a driving interval A (refer to FIG. 4) of one frame, and may output a bias signal to the data lines DL1-DLm during a scan interval B (refer to FIG. 4) of one frame.

The voltage generator 300 may generate voltages necessary for an operation of the display panel DP. In an embodiment of the disclosure, the voltage generator 300 may generate a first driving voltage ELVDD, a second driving voltage ELVSS, a first initialization voltage Vinit1, and a second initialization voltage Vinit2, and a bias voltage Vbias.

In an embodiment, the first initialization voltage Vinit1 may have a voltage level higher than the second initialization voltage Vinit2, for example, but a voltage level of each of the first initialization voltage Vinit1 and the second initialization voltage Vinit2 is not limited thereto. In an alternative embodiment, for example, the first initialization voltage Vinit1 and the second initialization voltage Vinit2 may have a same voltage level as each other.

The display panel DP may include scan lines GIL1-GILn, GCL1-GCLn, GWL1-GWLn, and GDL1-GDLn, light emitting control lines EML11-EML1$n$ and EML21-EML2$n$, data lines DL1-DLm, and pixels PX. The display panel DP may further include a scan driving circuit SD and a light emitting driving circuit EDC.

The scan driving circuit SD may be arranged on a first side of the display panel DP. The scan lines GIL1-GILn, GCL1-GCLn, GWL1-GWLn, and GDL1-GDLn may extend in the first direction DR1 from the scan driving circuit SD.

The light emitting driving circuit EDC is arranged on a second side of the display panel DP. The light emitting control lines EML11-EML1$n$ and EML21-EML2$n$ may extend in a direction opposite to the first direction DR1 from the light emitting driving circuit EDC.

The scan lines GIL1-GILn, GCL1-GCLn, GWL1-GWLn, and GDL1-GDLn and the light emitting control lines EML11-EML1$n$ and EML21-EML2$n$ may be arranged apart from each other in the second direction DR2.

The data lines DL1-DLm may extend in a direction opposite to the second direction DR2 from the data driving circuit 200. The data lines DL1-DLm may be arranged apart from each other in the first direction DR1.

In an embodiment, as shown in FIG. 1, the scan driving circuit SD and the light emitting driving circuit EDC may be arranged to face with each other across the pixels PX, but not limited thereto. In an alternative embodiment, for example, the scan driving circuit SD and the light emitting driving circuit EDC may be disposed adjacent to any one of a first side and a second side of the display panel DP. In an embodiment, the scan driving SD and the light emitting driving circuit EDC may be configured as one circuit.

The plurality of pixels PX may be connected to the scan lines GIL1-GILn, GCL1-GCLn, GWL1-GWLn, and GDL1-GDLn, the light emitting control lines EML11-EML1n and EML21-EML2n, and the data lines DL1-DLm, respectively. In an embodiment, each of the plurality of pixels PX may be connected to four scan lines and two light emitting control lines.

Figure 3:
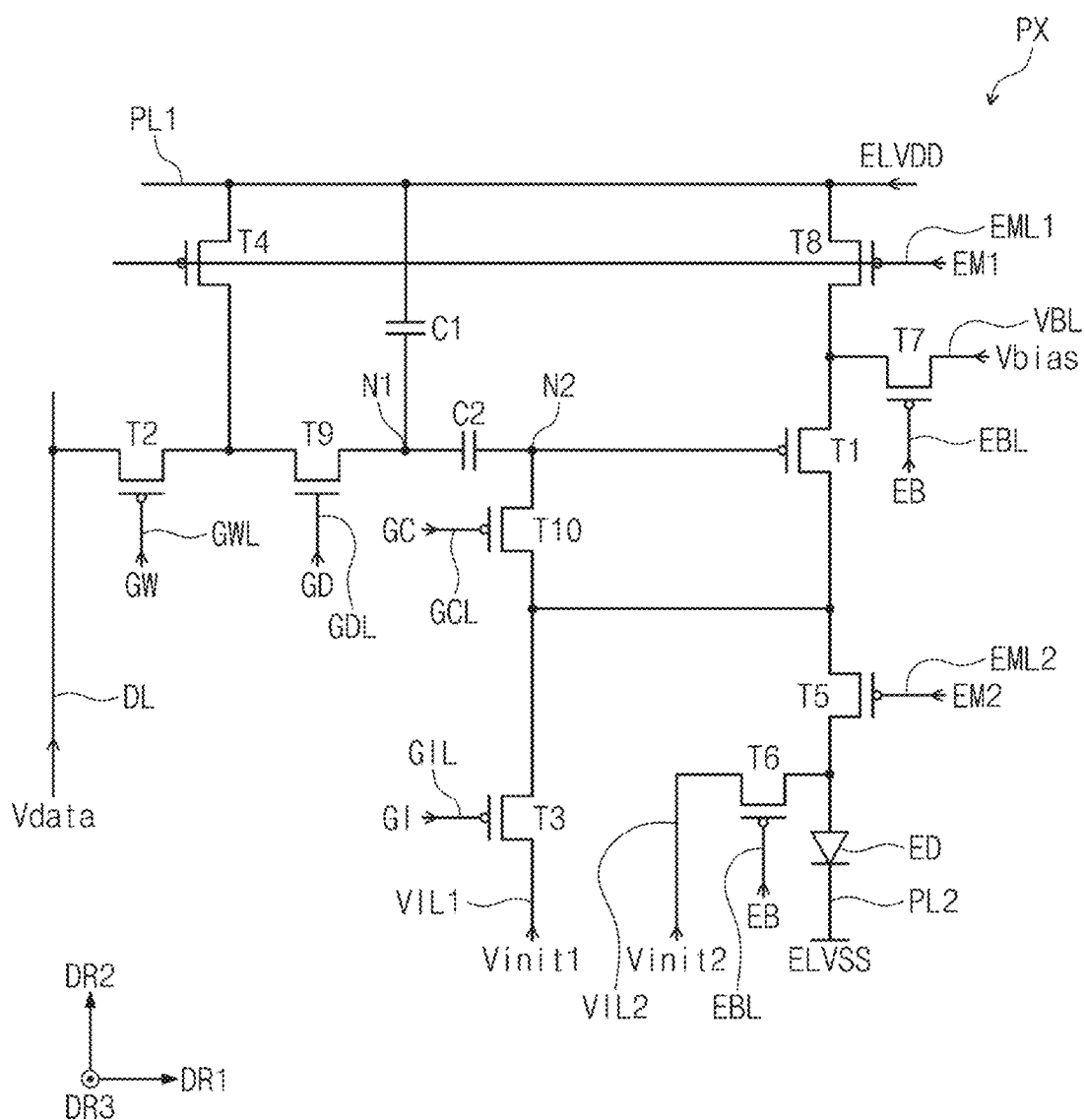
FIG. 3 is an equivalent circuit diagram of a pixel according to an embodiment of the disclosure.

Each of the plurality of pixels PX may include a light emitting diode ED (refer to FIG. 3) and a pixel circuit part for controlling light emission of the light emitting diode ED (refer to FIG. 3).

The light emitting diode ED (refer to FIG. 3) of each of the plurality of pixels PX may generate one of different color lights. In an embodiment, for example, the plurality of pixels PX may include red pixels, each of which generates a red color light, green pixels, each of which generates a green color light, and blue pixels, each of which generates a blue color light. A light emitting diode of a red pixel, a light emitting diode of a green pixel, and a light emitting diode of a blue pixel may include light emitting layers of different materials.

The pixel circuit part may include at least one transistor and at least one capacitor. This will be described in greater detail below. The scan driving circuit SD and the light emitting driving circuit EDC may include transistors formed through a same process as transistors of the pixel circuit part.

Each of the plurality of pixels PX may receive the first driving voltage ELVDD, the second driving voltage ELVSS, the first initialization voltage Vinit1, the second initialization voltage Vinit2, and the bias voltage Vbias from the voltage generator 300.

The scan driving circuit SD may receive a scan control signal SCS from the driving controller 100. The scan driving circuit SD may output scan signals to the scan lines GIL1-GILn, GCL1-GCLn, GWL1-GWLn, and GDL1-GDLn in response to the scan control signal SCS.

The light emitting driving circuit EDC may output light emitting signals to the light emitting control lines EML11-EML1n and EML21-EML2n in response to a light emitting driving control signal ECS from the driving controller 100.

In an embodiment, the driving controller 100 may determine a driving frequency and may control the data driving circuit 200, the scan driving circuit SD, and the light emitting driving circuit EDC depending on the determined driving frequency.

FIG. 3 is an equivalent circuit diagram of a pixel according to an embodiment of the disclosure. Each of the plurality of pixels PX shown in FIG. 2 may have a same circuit configuration as the equivalent circuit diagram of the pixel PX shown in FIG. 3.

Referring to FIG. 3, an embodiment of the pixel PX may include first to tenth transistors T1, T2, T3, T4, T5, T6, T7, T8, T9, and T10, capacitors C1 and C2, and a light emitting diode ED. In such an embodiment, the pixel PX may be referred to as having a 10T2C structure.

In an embodiment, each of the first to eighth transistors T1-T8 may be a P-type transistor having a low-temperature polycrystalline silicon ("LTPS") semiconductor layer, and each of the ninth and tenth transistors T9 and T10 may be an N-type transistor which has an oxide semiconductor as a semiconductor layer, for example, but not being limited thereto. Alternatively, all the first to tenth transistors T1-T10 according to an embodiment of the disclosure may be the P-type transistors or the N-type transistors. In an embodiment, at least one of the first to tenth transistors T1-T10 may be the P-type transistor, and the others of the first to tenth transistors T1-T10 may be the N-type transistors.

The scan lines GIL, GCL, GWL, GDL, and EDL may deliver or transmits scan signals GI, GC, GW, GD, and ED, respectively. The light emitting control lines EML1 and EML2 may deliver light emitting signals EM1 and EM2. A data line DL may deliver a data signal Vdata. The data signal Vdata may have a voltage level corresponding to an image signal RGB input to an electronic device DD (refer to FIG. 1). A first voltage line PL1 may deliver a first driving voltage ELVDD. A second voltage line PL2 may deliver the second driving voltage ELVSS. A first initialization voltage line VIL1 may deliver a first initialization voltage Vinit1. A second initialization voltage line VIL2 may deliver a second initialization voltage Vinit2.

The first capacitor C1 may be connected between the first voltage line PL1 and a first node N1.

The second capacitor C2 may be connected between the first node N1 and a second node N2.

The light emitting diode ED may include a first electrode connected with the first voltage line PL1 via the first transistor T1, the fifth transistor T5 and the eighth transistor T8, and a second electrode connected with the second voltage line PL2. The first electrode of the light emitting diode ED may be referred to as an anode electrode.

The first transistor T1 includes a first electrode connected with the first voltage line PL1 via the eighth transistor T8, a second electrode connected with the first electrode of the light emitting diode ED via the fifth transistor T5, and a gate electrode connected to the second node N2. The first transistor T1 may be referred to as a driving transistor.

The second transistor T2 may include a first electrode connected with the data line DL, a second electrode connected with the first node N1 via the ninth transistor T9, and a gate electrode that receives the first scan signal GW. The second transistor T2 may be referred to as a switching transistor.

The third transistor T3 may include a first electrode connected with the second node N2 via the tenth transistor T10, a second electrode connected with the first initialization voltage line VIL1, and a gate electrode that receives the initialization scan signal GI. The first electrode of the third transistor T3 may be connected with each of a second electrode of the tenth transistor T10, the second electrode of the first transistor T1, and a first electrode of the fifth transistor T5.

The fourth transistor T4 may include a first electrode connected with the first voltage line PL1, a second electrode connected to each of the second electrode of the second transistor T2 and a first electrode of the ninth transistor T9, and a gate electrode that receives the first light emitting signal EM1.

The fifth transistor T5 may include a first electrode connected with the first electrode of the light emitting diode ED, a second electrode connected with the second electrode of the first transistor T1, and a gate electrode that receives the second light emitting signal EM2.

The sixth transistor T6 may include a first electrode connected with the second initialization voltage line VIL2, a second electrode connected with each of the first electrode of the light emitting diode ED and the first electrode of the fifth transistor T5, and a gate electrode that receives a second scan signal EB through a second scan line EBL. The second initialization voltage Vinit2 supplied from the second initialization voltage line VIL2 may be less than the first initialization voltage Vinit1.

The seventh transistor T7 may include a first electrode connected with the first electrode of the first transistor T1 and a second electrode of the eighth transistor T8, a second electrode connected with a bias voltage line VBL, and a gate electrode that receives the second scan signal EB.

The eighth transistor T8 may include a first electrode connected with the first voltage line PL1, the second electrode connected with the first electrode of the first transistor T1, and a gate electrode that receives the first light emitting signal EM1.

The ninth transistor T9 may include a first electrode connected with the second electrode of the second transistor T2, the second electrode connected with the first node N1, and a gate electrode that receives the second compensation scan signal GD. The ninth transistor T9 may be an oxide semiconductor.

The tenth transistor T10 may include a first electrode connected with the second nod N2, a second electrode connected with the first initialization voltage line VIL1 via the third transistor T3, and a gate electrode that receives the first compensation scan signal GC. The tenth transistor T10 may be an oxide semiconductor.

Figure 4:
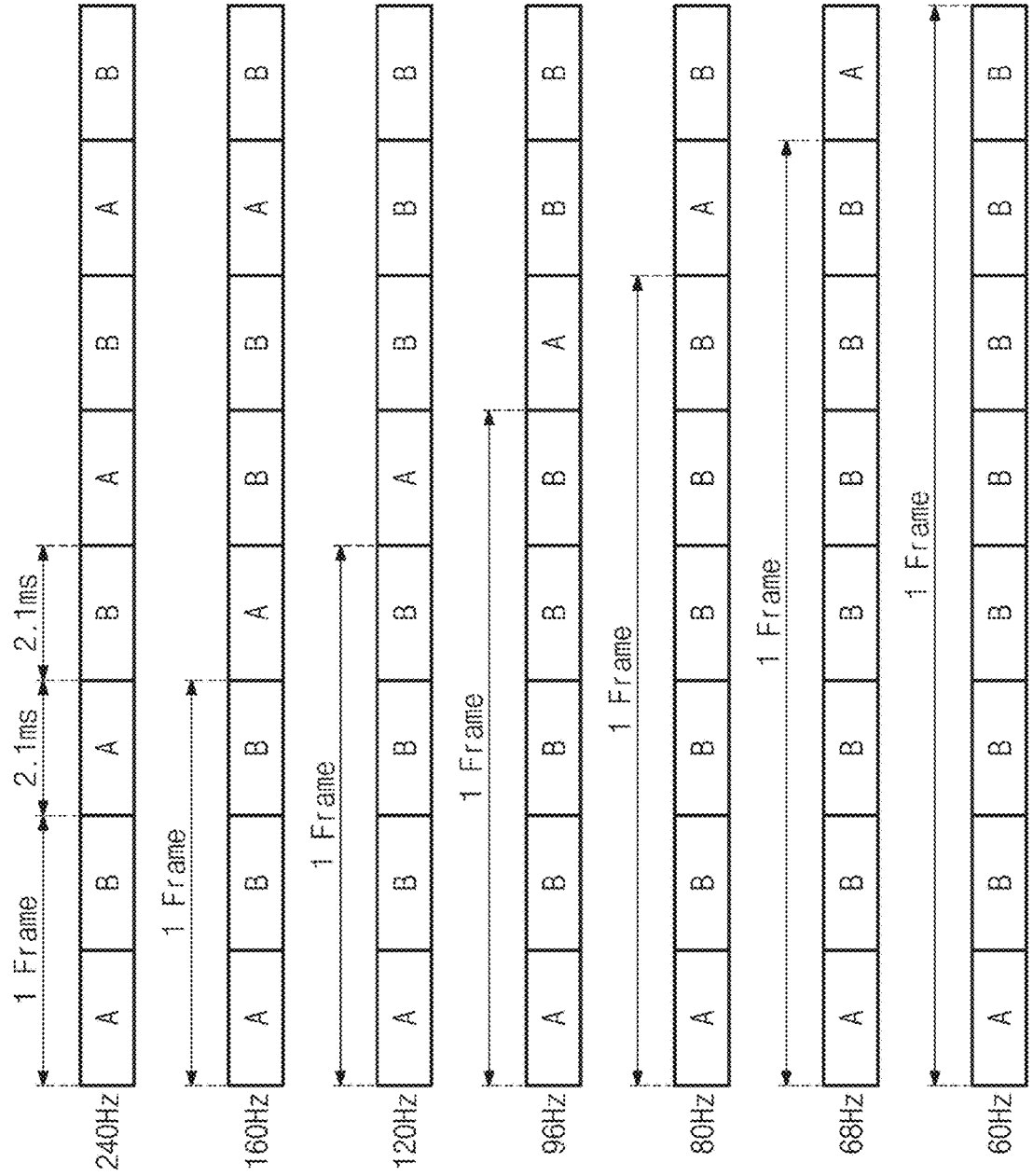
FIG. 4 illustrates driving frequencies according to a driving operation of an electronic device according to an embodiment of the disclosure.

FIG. 4 illustrates driving frequencies according to a driving operation of an electronic device according to an embodiment of the disclosure.

Referring to FIGS. 2 and 4, an embodiment of an electronic device DD (refer to FIG. 1) may adjust a driving frequency of a display panel DP by adjusting the number of a scan interval B in one frame 1 FRAME. The electronic device DD (refer to FIG. 1) may synchronize a timing between frame generation of a graphics processing unit included in the electronic device DD (refer to FIG. 1) and frame output of the display panel DP. In such an embodiment, the display panel DP may operate at a variable frequency. In such an embodiment, the display panel DP may be referred to as operating in a variable frequency mode. In an embodiment, for example, when an operating frequency of the electronic device DD (refer to FIG. 1) decreases in a specific operation environment such as still image display, power consumption of the electronic device DD (refer to FIG. 1) may decrease.

In an embodiment, each of a driving interval A and the scan interval B may be an interval having a time duration (or period) of 2.1 milliseconds (ms). In such an embodiment, each of the driving interval A and the scan interval B may have a frequency of 480 hertz (Hz), for example. However, a time duration of each of the driving interval A and the scan interval B is not limited thereto. In an alternative embodiment, for example, each of the driving interval A and the scan interval B may be an interval having a time duration of 4.2 ms.

When the graphics processing unit generates a frame having a scan rate of 240 Hz, a scan driving circuit SD may control to drive each of the driving interval A and the scan interval B once during one frame 1 FRAME, such that a display panel DP operates at a frequency of 240 Hz.

When the graphics processing unit generates a frame having a scan rate of 160 Hz, the scan driving circuit SD may control to drive the driving interval A once and drive the scan interval B two times during one frame 1 FRAME, such that the display panel DP operates at a frequency of 160 Hz.

When the graphics processing unit generates a frame having a scan rate of 120 Hz, the scan driving circuit SD may control to drive the driving interval A once and drive the scan interval B three times during one frame 1 FRAME, such that the display panel DP operates at a frequency of 120 Hz.

When the graphics processing unit generates a frame having a scan rate of 96 Hz, the scan driving circuit SD may control to drive the driving interval A once and drive the scan interval B four times during one frame 1 FRAME, such that the display panel DP operates at a frequency of 96 Hz.

When the graphics processing unit generates a frame having a scan rate of 80 Hz, the scan driving circuit SD may control to drive the driving interval A once and drive the scan interval B five times during one frame 1 FRAME, such that the display panel DP operates at a frequency of 80 Hz.

When the graphics processing unit generates a frame having a scan rate of 68 Hz, the scan driving circuit SD may control to drive the driving interval A once and drive the scan interval B six times during one frame 1 FRAME, such that the display panel DP operates at a frequency of 68 Hz.

When the graphics processing unit generates a frame having a scan rate of 60 Hz, the scan driving circuit SD may control to drive the driving interval A once and drive the scan interval B seventh times during one frame 1 FRAME, such that the display panel DP operates at a frequency of 60 Hz. However, the disclosure is not limited to those described above. The scan driving circuit SD may control the ratio of the driving interval A to the scan interval B, such that the display panel DP operates at various frequencies. In an alternative embodiment, for example, the scan driving circuit SD may control the ratio of the driving interval A to the scan interval B, such that the display panel DP operates at a frequency of 1 Hz.

FIG. 5A is a signal timing diagram of driving signals according to an embodiment of the disclosure. FIGS. 6A to 6E are diagrams illustrating an operation of a pixel according to an embodiment of the disclosure.

Figure 6A:
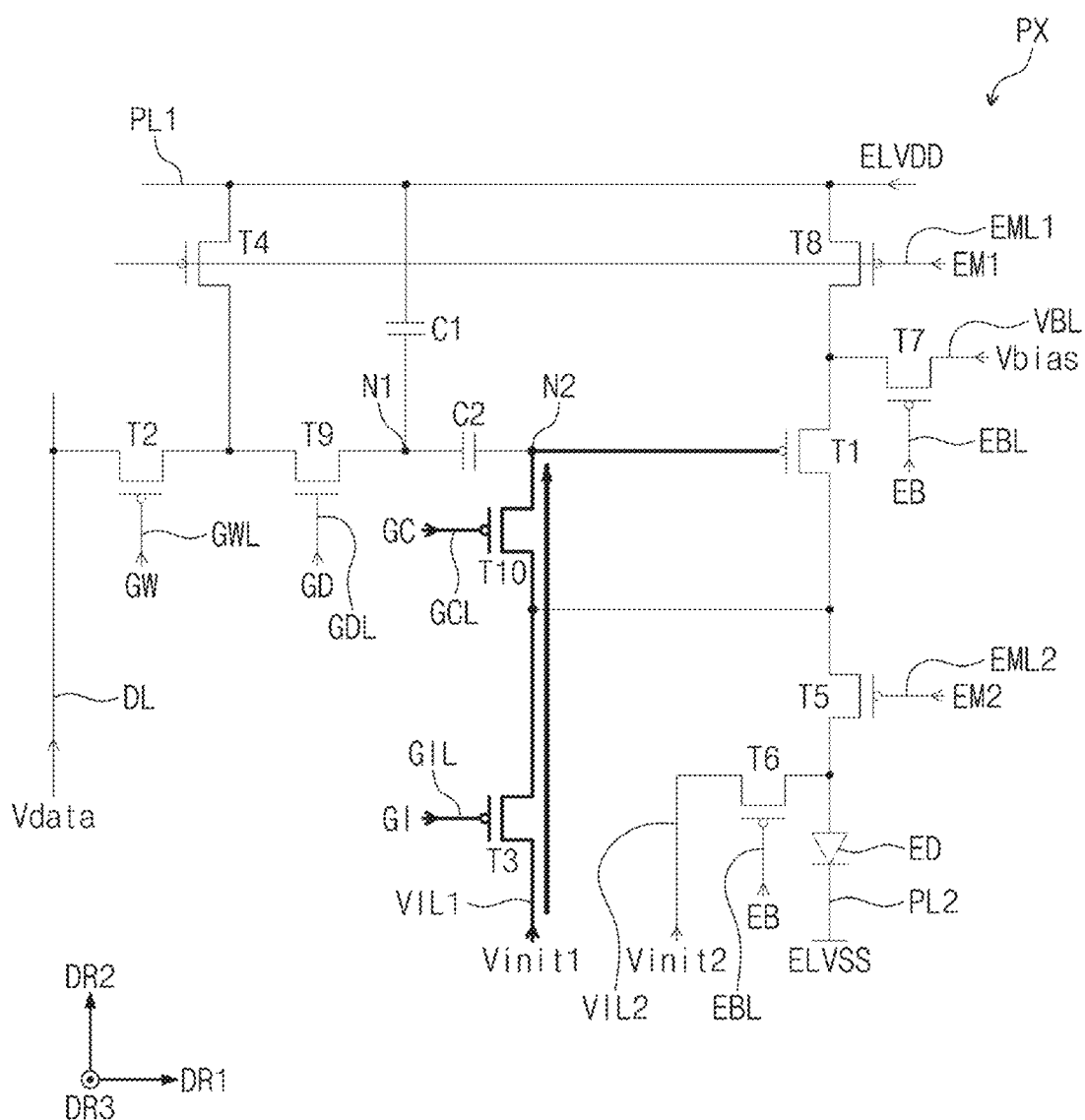
FIGS. 6A, 6B, 6C, 6D, and 6E are diagrams illustrating an operation of a pixel according to an embodiment of the disclosure.

FIG. 6A is a drawing illustrating an operation in a first interval t11 of a pixel.

Referring to FIGS. 5A and 6A, a driving interval A may include first to seventh intervals t11-t17.

FIG. 6A is a drawing illustrating an operation in a first interval t11 and a third interval t13 of a pixel.

An initialization scan signal GI and a first compensation scan signal GC may be in an active level during the first interval tn. The active level of the initialization scan signal GI may be a low level. The active level of the first compensation scan signal GC may be a high level.

A first light emitting signal EM1, a second light emitting signal EM2, a second compensation scan signal GD, a first scan signal GW, and a second scan signal EB may be in an inactive level during the first interval t11. The inactive level of each of the light emitting signal EM1, the second light emitting signal EM2, the first scan signal GW, and the second scan signal EB may be the high level. The inactive level of the second compensation scan signal GD may be the low level.

Accordingly, during the first interval t11, a tenth transistor T10 may be turned on in response to the first compensation scan signal GC, a third transistor T3 may be turned on in response to the initialization scan signal GI, and a first initialization voltage Vinit1 may be supplied to a gate electrode of a first transistor T1 via the third transistor T3 and the tenth transistor T10. In such an embodiment, a data signal Vdata of a previous frame may be provided to a first node N1, and the first initialization voltage Vinit1 may be supplied to a second node N2. The first interval t11 may be referred to as an initialization interval for initializing the gate electrode of the first transistor T1.

Figure 6B:
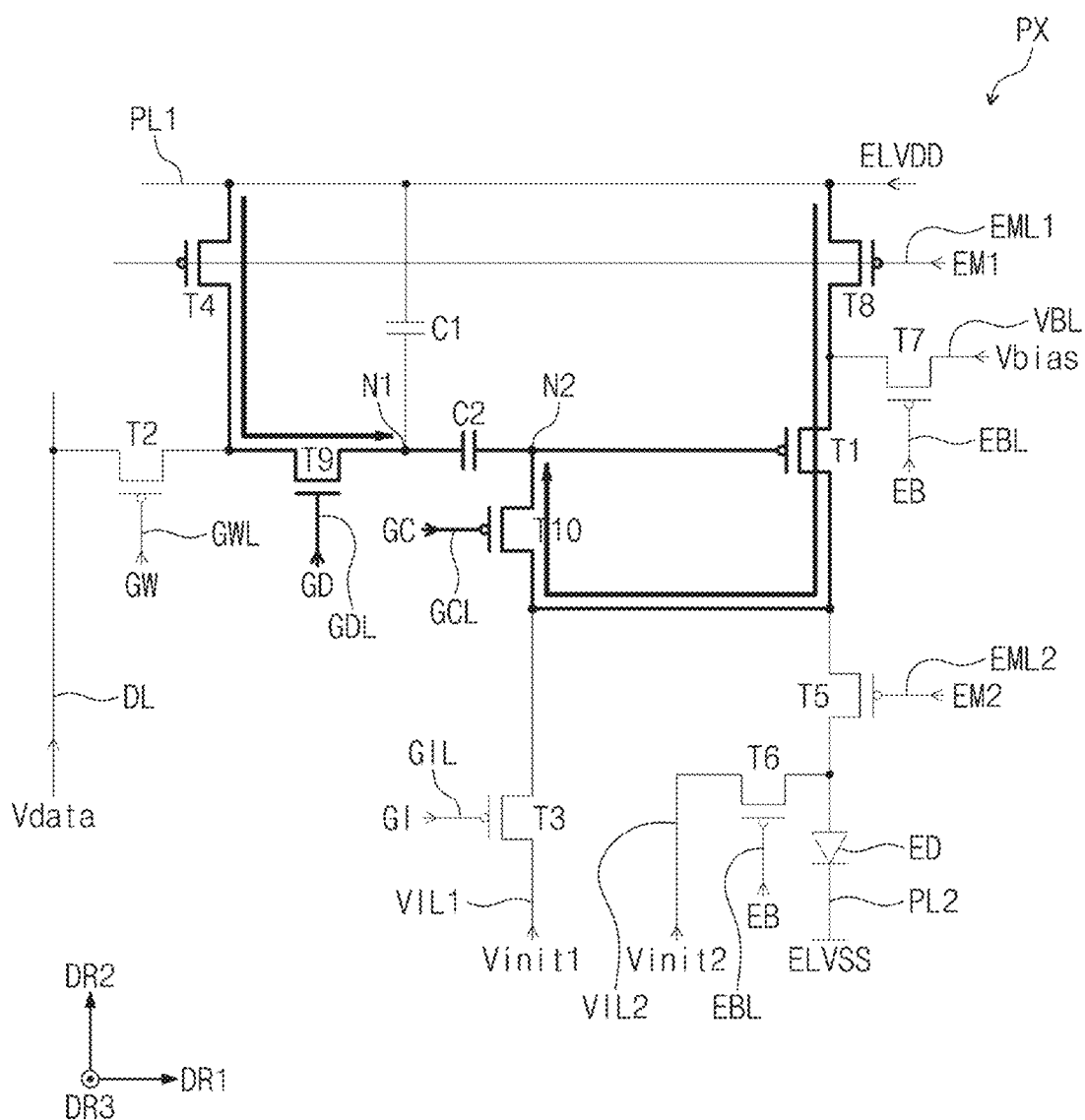

FIG. 6B is a drawing illustrating an operation in a second interval t12 and a fourth interval t14 of a pixel.

Referring to FIGS. 5A and 6B, the first light emitting signal EM1, the first compensation scan signal GC, and the second compensation scan signal GD may be in the active level during the second interval t12 of the driving interval A. The active level of the first light emitting signal EM1 may be the low level. The active level of the first compensation scan signal GC and the second compensation scan signal GD may be the high level.

The second light emitting signal EM2, the initialization scan signal GI, the first scan signal GW, and the second scan signal EB may be the inactive level during the second interval t12. The inactive level of each of the second light emitting signal EM2, the initialization scan signal GI, the first scan signal GW, and the second scan signal EB may be the high level.

Accordingly, during the second interval t12, a fourth transistor T4 and an eighth transistor T8 may be turned on in response to the first light emitting signal EM1, a ninth transistor T9 may be turned on in response to the second compensation scan signal GD, and the tenth transistor T10 may be turned on in response to the first compensation scan signal GC.

As the fourth transistor T4 and the ninth transistor T9 are turned on, a first driving voltage ELVDD may be supplied to the first node N1.

The first driving voltage ELVDD may be supplied to the first node N1. The voltage of the first node N1 may change to the first driving voltage ELVDD in the data signal Vdata of the previous frame. An electronic device DD (refer to FIG. 2) may use the first driving voltage ELVDD supplied through a first voltage line PL1, without using a separate reference voltage.

According to an embodiment of the disclosure, in a voltage generator 300 (refer to FIG. 2), a separate power line for supplying a reference voltage to the first node N1 may not be included such that an area of a non-display area NDA (refer to FIG. 1) may decrease. In such an embodiment, the number of power lines included in a pixel PX may decrease, an interval between wires included in the pixel PX may increase, and signal interference between the wires may decrease. Thus, the pixel and an electronic device DD (refer to FIG. 1), which have improved display quality, may be provided.

In an embodiment, when the first compensation scan signal GC is defined as an n-th compensation scan signal, the second compensation scan signal GD may be an (n+x)-th compensation scan signal. Here, x may be an integer.

According to an embodiment of the disclosure, the number of compensation scan driving circuits included in a scan driving circuit SD (refer to FIG. 2) may decrease. Thus, an area of the non-display area NDA (refer to FIG. 1) may decrease.

As an eighth transistor T8 and the tenth transistor T10 are turned on, a first transistor T1 may operate as a source follower. Here, the amount of change in voltage changed to the first driving voltage ELVDD may have an influence on a second node N2 in the data signal Vdata of the previous frame of the first node N1. A voltage (ELVDD−Vth+a), which is lower than the first driving voltage ELVDD supplied to a gate electrode of the first transistor T1 by a threshold voltage (denoted by "Vth") of the first transistor T1 and receives an influence (denoted by "a") by the voltage of the first node N1, may be supplied to the second node N2.

In an embodiment, each of the ninth transistor T9 and the tenth transistor T10 may include an oxide semiconductor layer. The oxide semiconductor layer may minimize a leakage current at a driving frequency lower than an LTPS semiconductor layer.

In a case, a leakage current may be generated by the tenth transistor T10 during the second interval t12. When a driving frequency is high (e.g., when the driving frequency is 240 Hz or 120 Hz), a change in luminance of a light emitting diode ED by the leakage current may fail to be large. However, when the driving frequency is low (e.g., when the driving frequency is a frequency of 60 Hz or less), a change in luminance in the light emitting diode ED by the leakage current may be viewed to or recognized by a user. In such a case, when the leakage current flows through the tenth transistor T10, a voltage level of the second node N2 may decrease. When the voltage level of the second node N2 decreases, because there is a change in voltage of the gate electrode of the first transistor T1, there may be a change in driving current which flows to the light emitting diode ED through the first transistor T1. A change in driving current which flows to the light emitting diode ED may change luminance, and the user may recognize the change in luminance, that is, the change in luminance is visible as a flicker. However, according to an embodiment of the disclosure, the ninth transistor T9 may be fabricated in a same process as the tenth transistor T10. The ninth transistor T9 and the tenth transistor T10 may minimize a leakage current at a low driving frequency. In such an embodiment, when a leakage current is generated in the tenth transistor T10, current may be supplied from the first voltage line PL1 to the first node N1 via the ninth transistor T9. In such an embodiment, because current is supplied via the ninth transistor T9 by the leakage current through the tenth transistor T10, a change in driving current which flows to the light emitting diode ED via the first transistor T1 may be effectively prevented. Thus, the pixel PX and an electronic device DD (refer to FIG. 1), which have improved display quality, may be provided.

In an embodiment, each of the first to eighth transistors T1-T8 may include an LTPS semiconductor layer. The LTPS semiconductor layer may have an area smaller than the oxide semiconductor layer. The LTPS semiconductor layer may have an electrical characteristic higher than the oxide semiconductor layer.

According to an embodiment of the disclosure, only the transistors T9 and T10 for preventing a leakage current among the transistors T1-T10 of the pixel PX may include an oxide semiconductor layer. In such an embodiment, the other transistors T1-T8 may include an LTPS semiconductor layer. In such an embodiment, an area of the pixel PX may be smaller than an area of a pixel including transistors including more than two oxide semiconductor layers. In such an embodiment, the number of pixels PX included in a display panel DP (refer to FIG. 2) may increase, and resolution of the electronic device DD (refer to FIG. 1) may increase. In such an embodiment, the overall electrical characteristic of the pixel PX may be improved. Thus, the electronic device DD (refer to FIG. 1) with improved display quality may be provided.

The second interval t12 may be referred to as a compensation interval. The user may control a time when the first light emitting signal EM1 is applied to control a compensation time. In an embodiment, for example, the compensation time may be to adjust and control a width of a gate electrode to which the first light emitting signal EM1 is provided.

Referring to FIGS. 5A and 6A, the initialization scan signal GI, the first compensation scan signal GC, and the second compensation scan signal GD may be in the active level during the third interval t13 of the driving interval A. The active level of the initialization scan signal GI may be the low level. The active level of each of the first compensation scan signal GC and the second compensation scan signal GD may be the high level.

The first light emitting signal EM1, the second light emitting signal EM2, the first scan signal GW, and the second scan signal EB may be in the inactive level during the third interval t13. The inactive level of each of the first light emitting signal EM1, the second light emitting signal EM2, the first scan signal GW, and the second scan signal EB may be the high level.

Accordingly, during the third interval t13, the tenth transistor T10 may be turned on in response to the first compensation scan signal GC, the third transistor T3 may be turned on in response to the initialization scan signal GI, and the first initialization voltage Vinit1 may be supplied to the gate electrode of the first transistor T1 via the third transistor T3 and the tenth transistor T10. In such an embodiment, the first driving voltage ELVDD supplied in the third interval t13 may be supplied to the first node N1, and the first initialization voltage Vinit1 may be supplied to the second node N2. The third interval t13 may be referred to as an initialization interval for initializing the gate electrode of the first transistor T1.

Referring to FIGS. 5A and 6B, the first light emitting signal EM1, the first compensation scan signal GC, and the second compensation scan signal GD may be in the active level during the fourth interval t14 of the driving interval A. The active level of the first light emitting signal EM1 may be the low level. The active level of each of the first compensation scan signal GC and the second compensation scan signal GD may be the high level.

The second light emitting signal EM2, the initialization scan signal GI, the first scan signal GW, and the second scan signal EB may be in the inactive level during the fourth interval t14. The inactive level of each of the second light emitting signal EM2, the initialization scan signal GI, the first scan signal GW, and the second scan EB may be the high level.

Accordingly, during the fourth interval t14, the fourth transistor T4 and the eighth transistor T8 may be turned on in response to the first light emitting signal EM1, the ninth transistor T9 may be turned on in response to the second compensation scan signal GD, and the tenth transistor T10 may be turned on in response to the first compensation scan signal GC.

As the fourth transistor T4 and the ninth transistor T9 are turned on, the first driving voltage ELVDD may be supplied to the first node N1.

The first driving voltage ELVDD may be supplied to the first node N1. The voltage of the first node N1 may change to the first driving voltage ELVDD in the data signal Vdata of the previous frame. The electronic device DD (refer to FIG. 2) may use the first driving voltage ELVDD supplied through the first voltage line PL1, without using a separate reference voltage.

According to an embodiment of the disclosure, in the voltage generator 300 (refer to FIG. 2), a separate power line for supplying a reference voltage to the first node N1 may not be included such that the area of the non-display area NDA (refer to FIG. 1) may decrease. In such an embodiment, the number of power lines included in the pixel PX may decrease, an interval between wires included in the pixel may increase, and signal interference between the wires may decrease. Thus, the pixel PX and the electronic device DD (refer to FIG. 1), which have improved display quality, may be provided.

In an embodiment, when the first compensation scan signal GC is defined as an n-th compensation scan signal, the second compensation scan signal GD may be an (n+x)-th compensation scan signal. Here, x may be an integer.

According to an embodiment of the disclosure, the number of compensation scan driving circuits included in the scan driving circuit SD (refer to FIG. 2) may decrease. Thus, an area of the non-display area NDA (refer to FIG. 1) may decrease.

As the eighth transistor T8 and the tenth transistor T10 are turned on, the first transistor T1 may operate as a source follower. A voltage (ELVDD−Vth), which is lower than the first driving voltage ELVDD supplied to the gate electrode of the first transistor T1 by a threshold voltage (Vth) of the first transistor T1, may be supplied to the second node N2.

Each of the ninth transistor T9 and the tenth transistor T10 may include an oxide semiconductor layer. The oxide semiconductor layer may minimize a leakage current at a driving frequency lower than an LTPS semiconductor layer.

In a case, a leakage current may be generated by the tenth transistor T10 during the five interval t15. When a driving frequency is high (e.g., when the driving frequency is 240 Hz or 120 Hz), a change in luminance of the light emitting diode ED by the leakage current may fail to be large. However, when the driving frequency is low (e.g., when the driving frequency is a frequency of 60 Hz or less), a change in luminance in the light emitting diode ED by the leakage current is visible to or recognized by the user. In this case, when the leakage current flows through the tenth transistor T10, the voltage level of the second node N2 may decrease. When the voltage level of the second node N2 decreases, because there is a change in voltage of the gate electrode of the first transistor T1, there may be a change in driving current which flows to the light emitting diode ED via the first transistor T1. A change in driving current which flows to the light emitting diode ED may change luminance, and the user may recognize the change in luminance, that is, the change in luminance is visible as a flicker. However, according to an embodiment of the disclosure, the ninth transistor T9 may be fabricated in a same process as the tenth transistor T10. The ninth transistor T9 and the tenth transistor T10 may minimize a leakage current at a low driving frequency. In such an embodiment, when a leakage current is generated in the tenth transistor T10, current may be supplied from the first voltage line PL1 to the first node N1 via the ninth transistor T9. In such an embodiment, because current is supplied via the ninth transistor T9 by a leakage current through the tenth transistor T10, a change in driving current which flows to the light emitting diode ED via the first transistor T1 may be effectively prevented. Thus, the pixel PX and the electronic device DD (refer to FIG. 1), which have improved display quality, may be provided.

In an embodiment, each of the first to eighth transistors T1-T8 may include an LTPS semiconductor layer. The LTPS semiconductor layer may have an area smaller than the oxide semiconductor layer. The LTPS semiconductor layer may have an electrical characteristic higher than the oxide semiconductor layer.

According to an embodiment of the disclosure, only the transistors T9 and T10 for preventing a leakage current among the transistors T1-T10 of the pixel PX may include an oxide semiconductor layer. In such an embodiment, the other transistors T1-T8 may include an LTPS semiconductor layer. An area of the pixel PX may be smaller than an area of a pixel including transistors including more than two oxide semiconductor layers. In such an embodiment, the number of pixels PX included in the display panel DP (refer to FIG. 2) may increase, and resolution of the electronic device DD (refer to FIG. 1) may increase. In such an embodiment, the overall electrical characteristic of the pixel PX may be improved. Thus, the electronic device DD (refer to FIG. 1) with improved display quality may be provided.

The fourth interval t14 may be referred to as a compensation interval. The user may control a time when the first light emitting signal EM1 is applied to control a compensation time. In an embodiment, for example, the compensation time may be to adjust and control a width of the gate electrode to which the first light emitting signal EM1 is provided.

Figure 6C:
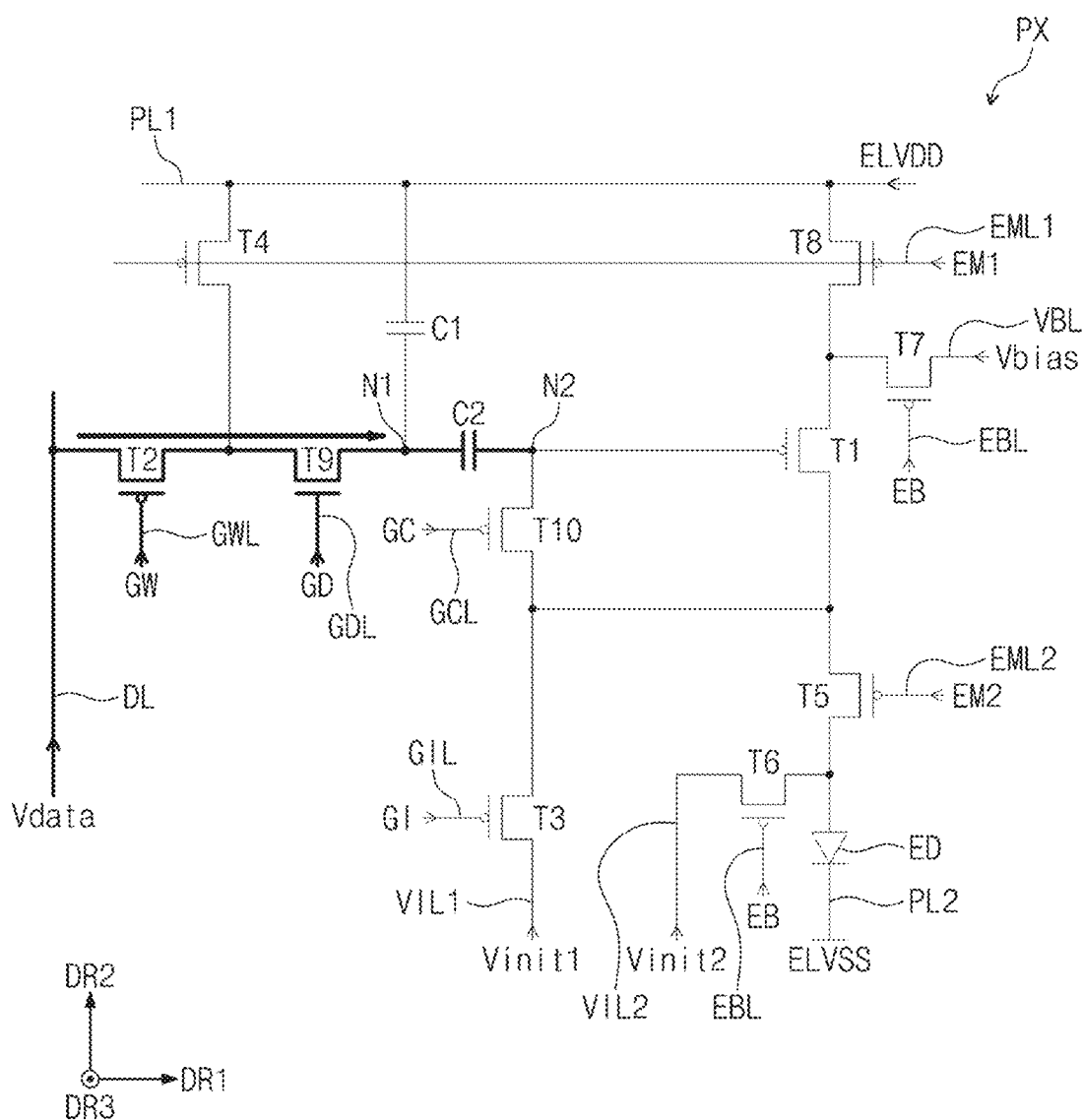

Referring to FIGS. 5A and 6C, the second compensation scan signal GD and the first scan signal GW may be in the active level during the fifth interval t15 of the driving interval A. The active level of the second compensation scan signal GD may be the high level. The active level of the first scan signal GW may be the low level.

The light emitting signal EM1, the second light emitting signal EM2, the initialization scan signal GI, the first compensation scan signal GC, and the second scan signal EB may be in the inactive level during the fifth interval t15.

Accordingly, during the fifth interval t15, the second transistor T2 may be turned on in response to the first scan signal GW, and the ninth transistor T9 may be turned on in response to the second compensation scan signal GD.

A data signal provided through the data line DL may be provided to the first node N1 during the fifth interval t15. When one end of a second capacitor C2, that is, a voltage level of the first node N1 changes to a voltage level of the data signal Vdata, the other end of the second capacitor C2, that is, a voltage of the gate electrode of the first transistor T1 may change to Vdata-Vth. The fifth interval t15 may be referred to as a write interval for providing a voltage level corresponding to the data signal Vdata to the one end of the second capacitor C2.

Figure 6D:
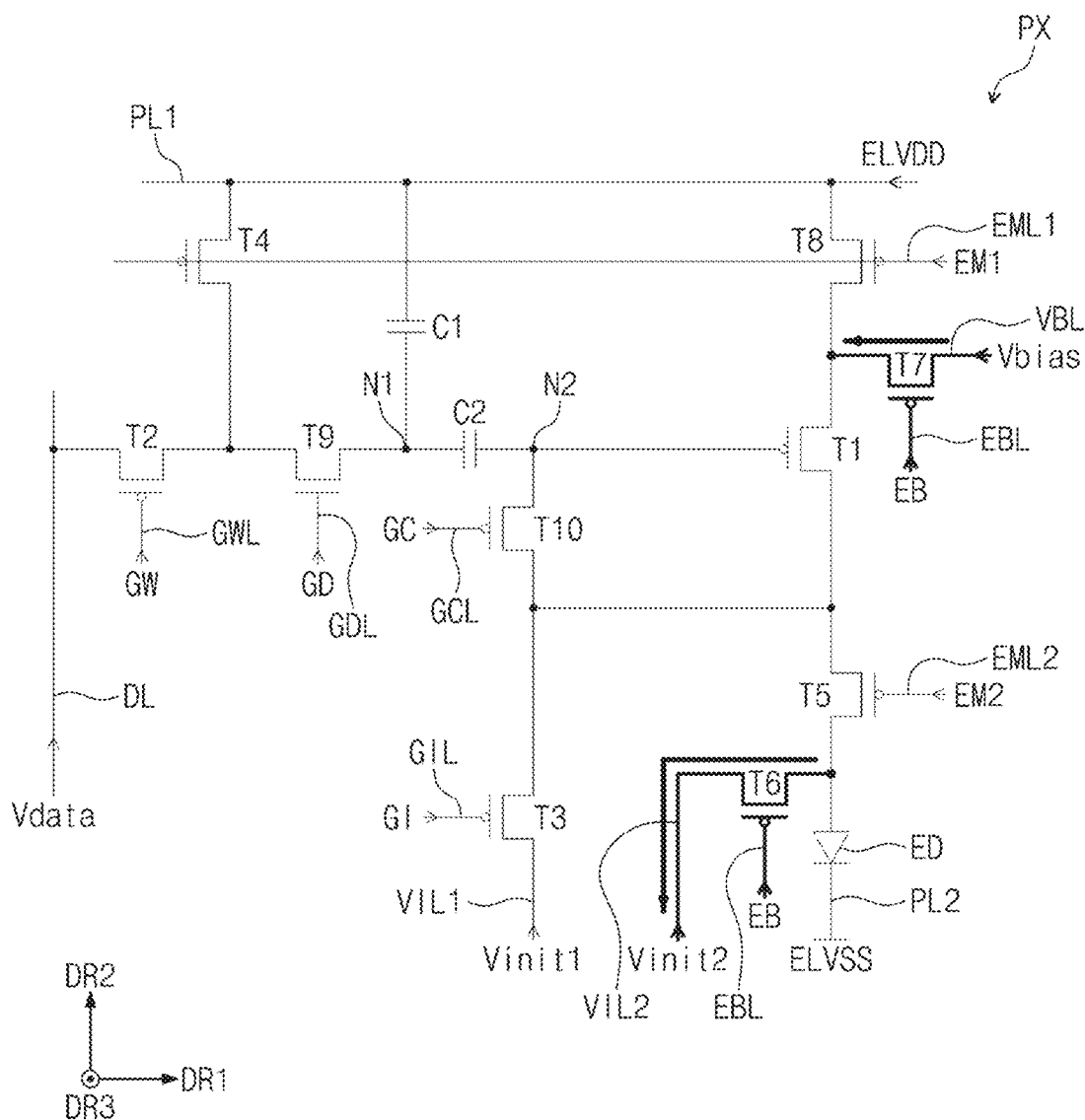

Referring to FIGS. 5A and 6D, the second scan signal EB may be in the active level during the sixth interval t16 of the driving interval A. The active level of the second scan signal EB may be the low level.

The light emitting signal EM1, the second light emitting signal EM2, the initialization scan signal GI, the first compensation scan signal GC, the second compensation scan signal GD, and the first scan signal GW may be in the inactive level during the sixth interval t16.

Accordingly, during the sixth interval t16, the sixth transistor T6 and the seventh transistor T7 may be turned on in response to the second scan signal EB.

As the sixth transistor T6 is turned on, the second initialization voltage Vinit2 may supplied to a first electrode of the light emitting diode ED. The sixth transistor T6 may bypass a current of the first electrode of the light emitting diode ED. In such an embodiment, the sixth transistor T6 may prevent the light emitting diode ED from being instantaneously lighted at high luminance by a residual voltage which remains in the first electrode of the light emitting diode ED at the beginning of the driving of the light emitting diode ED. The sixth interval t16 may be referred to as a black initialization interval.

According to an embodiment of the disclosure, a second initialization voltage Vinit2 different from a first initialization voltage Vinit1 may be supplied to the sixth transistor T6. The second initialization voltage Vinit2 may have a level lower than the first initialization voltage Vinit1. In such an embodiment, an optimal initialization voltage for removing a residual voltage may be supplied to the light emitting diode ED. In such an embodiment, a stain on a display surface FS (refer to FIG. 1) may be effectively prevented from being viewed by an initialization voltage supplied to the light emitting diode ED at low illumination. Thus, the pixel PX and the electronic device DD (refer to FIG. 1), which have improved display quality, may be provided.

When the seventh transistor T7 is turned on, a bias voltage Vbias may be supplied to the first electrode of the first transistor T1. The bias voltage Vbias may have a certain voltage level. in an embodiment, for example, the certain voltage level may be a voltage level between 3 voltages (V) to 7 V. The sixth interval t16 may be referred to as a bias interval.

In a case, a driving current of the first transistor T1 by the data signal Vdata applied in the driving interval A of a current frame may be influenced by the data signal Vdata applied in the driving interval A of a previous frame due to a hysteresis characteristic of the first transistor T1. A change in luminance is visible to the user due to the hysteresis characteristic in a variable frequency mode in which the driving frequency of the electronic device DD (refer to FIG. 1) changes. However, according to an embodiment of the disclosure, as the bias voltage Vbias is supplied to the first electrode of the first transistor T1 in the sixth interval t16, a change in luminance due to a hysteresis characteristic of the first transistor T1 may be minimized. Thus, the pixel PX and the electronic device DD (refer to FIG. 1), which have improved display quality, may be provided.

In an embodiment, when the first scan signal GW is defined as an n-th scan signal, the second scan signal EB may be an (n+y)-th scan signal. Here, y may be an integer.

According to an embodiment of the disclosure, the number of compensation scan driving circuits included in the scan driving circuit SD (refer to FIG. 2) may decrease. Thus, an area of the non-display area NDA (refer to FIG. 1) may decrease.

Figure 6E:
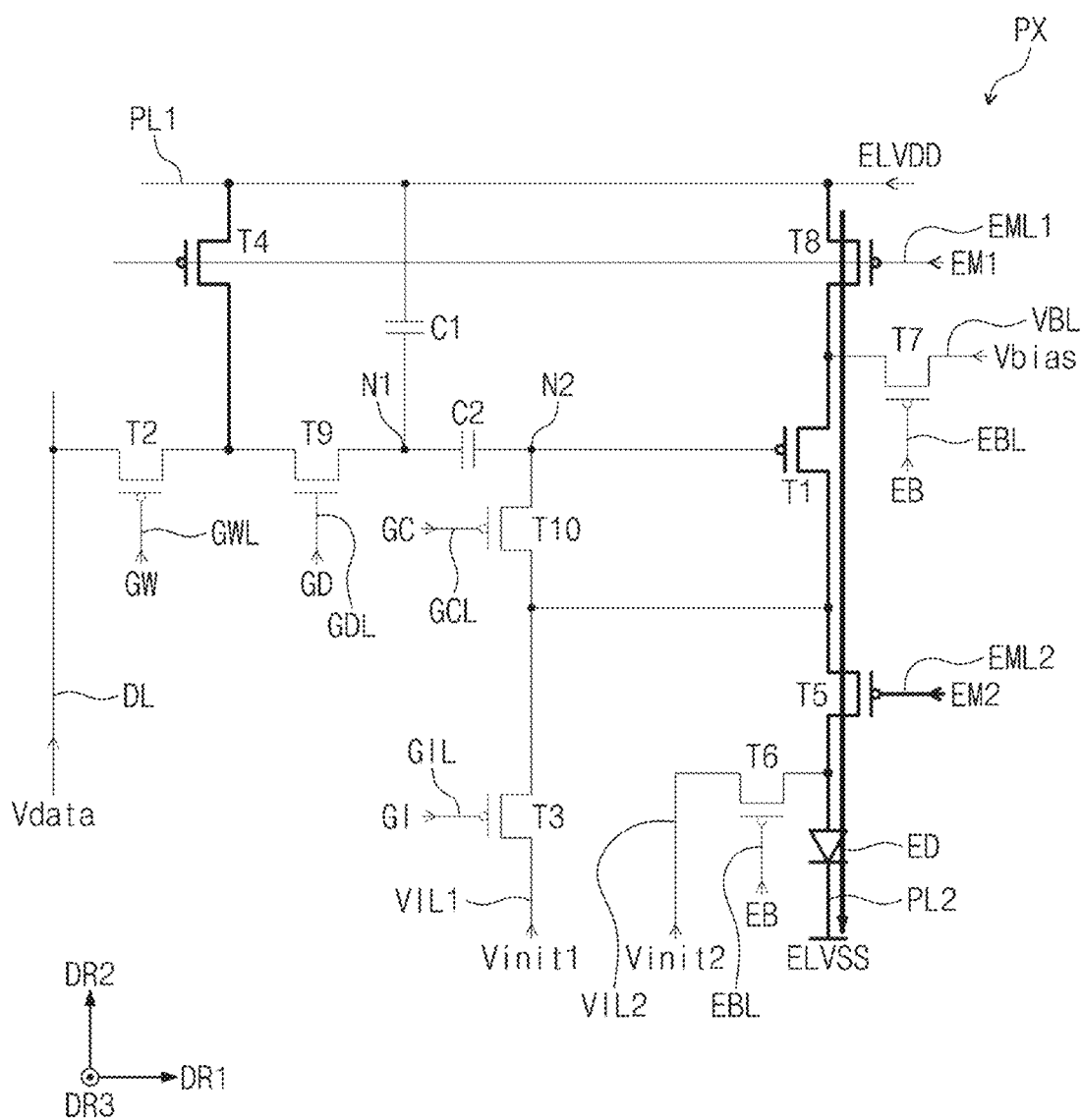

Referring to FIGS. 5A and 6E, the first light emitting signal EM1 and the second light emitting signal EM2 may be in the active level during the seventh interval t17 of the driving interval A. The active level of each of the first light emitting signal EM1 and the second light emitting signal EM2 may be the low level.

The initialization scan signal GI, the first compensation scan signal GC, the second compensation scan signal GD, the first scan signal GW, and the second scan signal EB may be in the inactive level during the seventh interval t17. The inactive level of each of the initialization scan signal GI, the first scan signal GW, and the second scan signal EB may be the high level. The active level of each of the first compensation scan signal GC and the second compensation scan signal GD may be the low level.

Accordingly, during the seventh interval t17, the eighth transistor T8 may be turned on in response to the first light emitting signal EM1, and the fifth transistor T5 may be turned on in response to the second light emitting signal EM2.

As the fifth transistor T5 and the eighth transistor T8 are turned on, a current path may be established to the light emitting diode ED via the eighth transistor T8, the first transistor T1, and the fifth transistor T5 from the first voltage line PL1.

Current flowing through the light emitting diode ED may be proportional to the square, $(Vgs-Vth)^2$, of a difference between a gate-source voltage (defined by "Vgs") of the first transistor T1 and a threshold voltage of the first transistor T1. Because the voltage level of the gate electrode of the first transistor T1 is Vdata-Vth, current flowing through the light emitting diode ED may be proportional to the square, $(ELVDD-Vdata)^2$, of a difference between the first driving voltage ELVDD and the data signal Vdata. The seventh interval t17 may be referred to a light emitting interval of the light emitting diode ED.

According to an embodiment of the disclosure, the threshold voltage of the first transistor T1 may fail to have an influence on current flowing through the light emitting diode ED by the second to seventh intervals t12 to t17. A threshold voltage of the first transistor T1 included in each of the pixels PX may vary based on a characteristic of the first transistor T1. However, in an embodiment, current subsequently flowing through the light emitting diode ED may be kept constant in the first integer t11, irrespective of the characteristic of the first transistor T1 included in each of the pixels PX. In such an embodiment, current flowing through the light emitting diode ED may be proportional to the square, $(ELVDD-Vdata)^2$, of a difference between the first driving voltage ELVDD and the data signal Vdata. Thus, the pixel PX and the electronic device DD (refer to FIG. 1), which have improved display quality, may be provided.

FIG. 5B is a signal timing diagram of driving signals according to an embodiment of the disclosure.

Referring to FIG. 5B, a light emitting signal EM1, a second light emitting signal EM2, an initialization scan signal GI, a first compensation scan signal GC, a second compensation scan signal GD, a first scan signal GW, and a second scan signal EB may be in an inactive level during a scan interval B. The scan interval B may be referred to as a self-scan interval.

Figure 7:
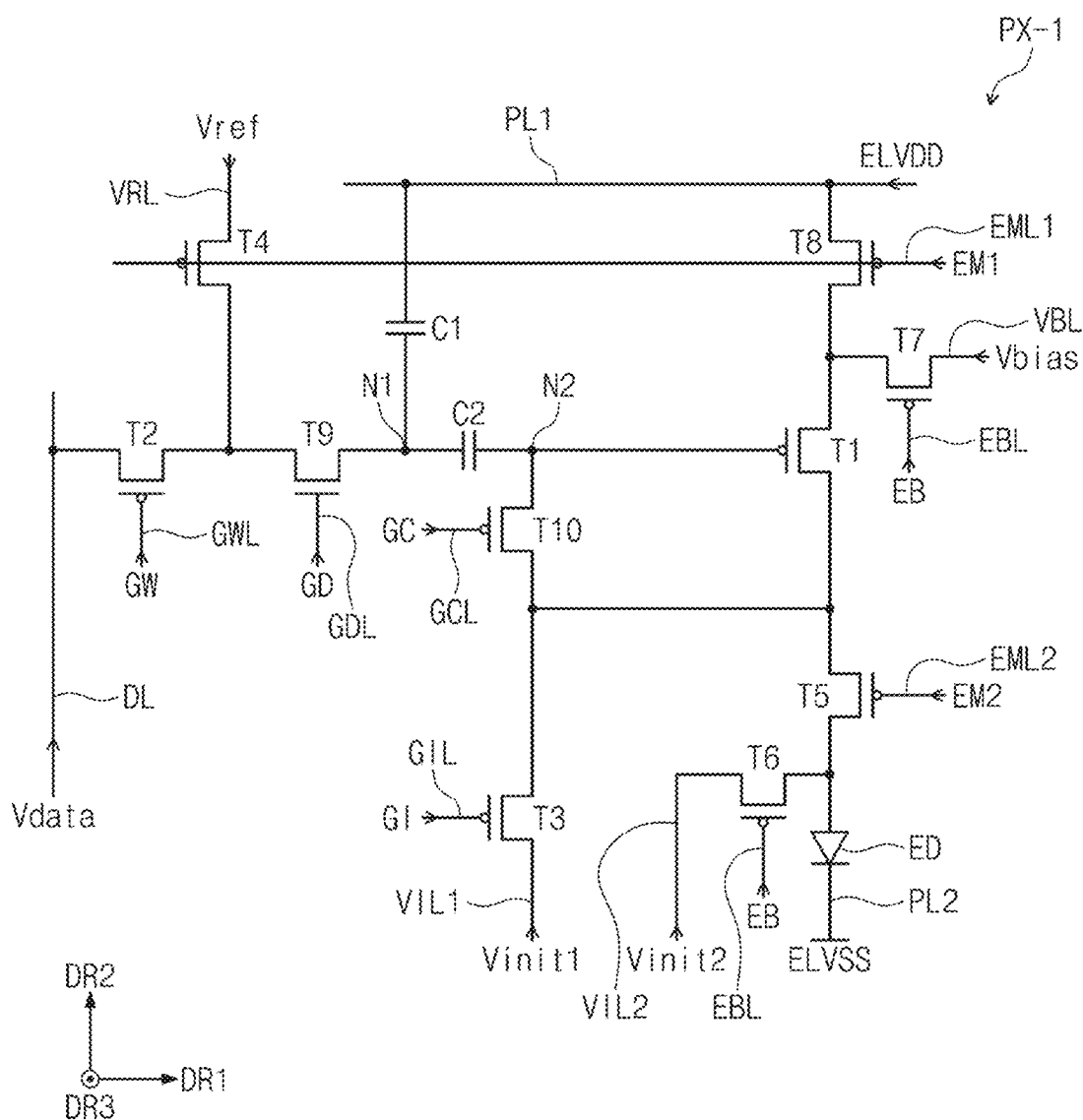
FIG. 7 is an equivalent circuit diagram of a pixel according to an alternative embodiment of the disclosure.

FIG. 7 is an equivalent circuit diagram of a pixel according to an embodiment of the disclosure. In FIG. 7, the same or like elements as those shown in FIG. 3 are labeled with the same reference characters as used above to describe the embodiment of the pixel shown in FIG. 3, and any repetitive detailed description thereof will hereinafter be omitted or simplified.

Referring to FIG. 7, in an embodiment, a voltage generator 300 (refer to FIG. 2) may further supply a reference voltage Vref to a display panel DP (refer to FIG. 2). A reference voltage line VRL to which the reference voltage Vref is supplied may be provided in a pixel PX-1. In such an embodiment, a first electrode of the fourth transistor T4 may be connected with the reference voltage line VRL. The reference voltage Vref may have a level lower than the first driving voltage ELVDD.

The voltage generator 300 (refer to FIG. 2) may supply an optimal voltage for compensating for a threshold voltage of the first transistor T1 to the first node N1 in the third interval t13 and the fifth interval t15.

In such an embodiment, as described above, when the fourth transistor T4 and a ninth transistor T9 are turned on during the third interval t13 and the fifth interval t15, the reference voltage Vref may be supplied to the first node N1. In such an embodiment, as described above, when an eighth transistor T8 and a tenth transistor T10 are turned on, the first transistor T1 may operate as a source follower. A voltage (Vref-Vth), which is lower than the reference voltage Vref supplied to the gate electrode of the first transistor T1 by a threshold voltage of the first transistor T1, may be supplied to a second node N2. In such an embodiment, a voltage difference between both ends of the second capacitor C2 may be the same as the threshold voltage of the first transistor T1.

Figure 8:
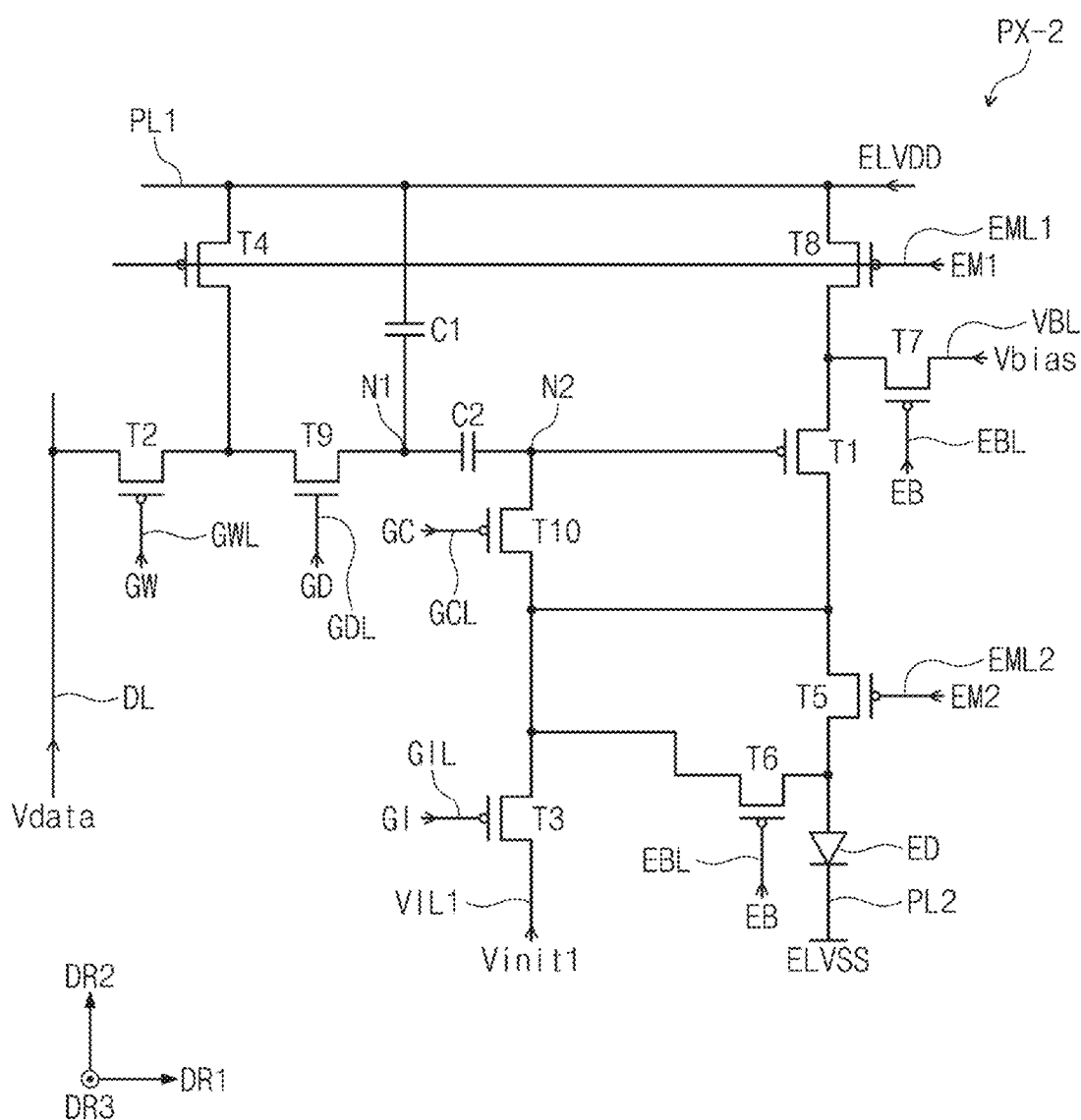
FIG. 8 is an equivalent circuit diagram of a pixel according to another alternative embodiment of the disclosure.

FIG. 8 is an equivalent circuit diagram of a pixel according to another alternative embodiment of the disclosure. In FIG. 8, the same or like elements as those shown in FIG. 3 are labeled with the same reference characters as used above to describe the embodiment of the pixel shown in FIG. 3, and any repetitive detailed description thereof will hereinafter be omitted or simplified.

Referring to FIG. 8, in an embodiment, a first electrode of a sixth transistor T6 may be connected to a first electrode of a third transistor T3.

In such an embodiment of the disclosure, a line for supplying a second initialization voltage Vinit2 (refer to FIG. 2) of a voltage generator 300 (refer to FIG. 2) may be omitted. Thus, an area of the non-display area NDA (refer to FIG. 1) may decrease.

As shown in FIG. 8, according to an embodiment of the disclosure, a second initialization voltage line VIL2 (refer to FIG. 3) for supplying a second initialization voltage Vinit2 (refer to FIG. 3) to a pixel PX-2 may be omitted. In such an embodiment, the number of power lines included in the pixel PX-2 may decrease, an interval between wires included in the pixel PX-2 may increase, and signal interference between the wires may decrease. Thus, the pixel PX-2 and the electronic device DD (refer to FIG. 1), which have improved display quality, may be provided.

According to embodiments of the invention, as described herein, the third transistor and the fourth transistor may be fabricated in a same process. The third transistor and the fourth transistor may minimize a leakage current at a low driving frequency. In such embodiments, when a leakage current is generated in the third transistor, current may be supplied from a first voltage line to a first node via the fourth transistor. In such an embodiment, because current is supplied via the fourth transistor by the leakage current through the third transistor, a change in driving current which flows to the light emitting diode via the first transistor may be effectively prevented. Thus, the pixel and an electronic device, which have improved display quality, may be provided.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A pixel, comprising:
  a first capacitor connected between a first node and a second node;
  a second capacitor connected between a first voltage line which supplies a first driving voltage and the first node;
  a light emitting diode including a first electrode, and a second electrode connected with a second voltage line which supplies a second driving voltage;
  a first transistor including a first electrode connected with the first voltage line, a second electrode connected with the first electrode of the light emitting diode, and a gate electrode connected with the second node;

a second transistor including a first electrode connected with a data line, a second electrode connected with the first node, and a gate electrode which receives a scan signal;

a third transistor including a first electrode connected with the second node, a second electrode connected with a first initialization voltage line which supplies a first initialization voltage, and a gate electrode which receives a first compensation scan signal;

a fourth transistor including a first electrode connected with the second electrode of the second transistor, a second electrode connected with the first node, and a gate electrode which receives a second compensation scan signal; and a fifth transistor including a first electrode, a second electrode connected with the second electrode of the second transistor and the first electrode of the fourth transistor, and a gate electrode which receives a first light emitting signal.

2. The pixel of claim 1, wherein the third transistor and the fourth transistor include an oxide semiconductor.

3. The pixel of claim 1, wherein the first electrode of the fifth transistor is connected with the first voltage line.

4. The pixel of claim 1, wherein the first electrode of the fifth transistor is connected with a reference voltage line which supplies a reference voltage.

5. The pixel of claim 1, further comprising:
a sixth transistor including a first electrode connected with the first voltage line, a second electrode connected with the first electrode of the first transistor, and a gate electrode which receives the first light emitting signal;
a seventh transistor including a first electrode connected with the second electrode of the third transistor, a second electrode connected with the first initialization voltage line, and a gate electrode which receives an initialization scan signal; and
an eighth transistor including a first electrode connected with the first electrode of the light emitting diode, a second electrode connected with the second electrode of the first transistor, and a gate electrode which receives a second light emitting signal.

6. The pixel of claim 5, further comprising:
a ninth transistor including a first electrode connected with the first electrode of the first transistor, a second electrode connected with a bias voltage line which supplies a bias voltage, and a gate electrode which receives the scan signal.

7. The pixel of claim 6, further comprising:
a tenth transistor including a first electrode, a second electrode connected with the first electrode of the light emitting diode, and a gate electrode which receives the scan signal.

8. The pixel of claim 7,
wherein the first electrode of the tenth transistor is connected with a second initialization voltage line which supplies a second initialization voltage, and
wherein the first initialization voltage has a voltage level higher than the second initialization voltage.

9. The pixel of claim 7, wherein the first electrode of the tenth transistor is connected to the first electrode of the seventh transistor.

10. The pixel of claim 7, further comprising:
a first scan line and a second scan line,
wherein the scan signal includes a first scan signal provided through the first scan line and a second scan signal provided through the second scan line.

11. The pixel of claim 10,
wherein the first scan signal is provided to the gate electrode of the second transistor, and
wherein the second scan signal is provided to the gate electrode of the eighth transistor and the gate electrode of the ninth transistor.

12. The pixel of claim 10, wherein the initialization scan signal and the first compensation scan signal are in an active level during a first interval.

13. The pixel of claim 12, wherein the first light emitting signal, the first compensation scan signal, and the second compensation scan signal are in an active level during a second interval subsequent to the first interval.

14. The pixel of claim 13, wherein the initialization scan signal, the first compensation scan signal, and the second compensation scan signal are in an active level during a third interval subsequent to the second interval.

15. The pixel of claim 14, wherein the first light emitting signal, the first compensation scan signal, and the second compensation scan signal are in an active level during a fourth interval subsequent to the third interval.

16. The pixel of claim 15, wherein the second compensation scan signal and the first scan signal are in an active level during a fifth interval subsequent to the fourth interval.

17. The pixel of claim 16, wherein the second scan signal is in an active level during a sixth interval subsequent to the fifth interval.

18. The pixel of claim 17,
wherein the first light emitting signal and the second light emitting signal are in an active level during a seventh interval subsequent to the sixth interval,
wherein one frame includes a driving interval and at least one scan interval, and
wherein the driving interval includes the first to seventh intervals.

19. An electronic device, comprising:
a display panel including a plurality of pixels,
wherein each of the plurality of pixels includes:
a first capacitor connected between a first node and a second node;
a second capacitor connected between a first voltage line which supplies a first driving voltage and the first node;
a light emitting diode including a first electrode and a second electrode connected with a second voltage line which supplies a second driving voltage;
a first transistor including a first electrode connected with the first voltage line, a second electrode connected with the first electrode of the light emitting diode, and a gate electrode connected with the second node;
a second transistor including a first electrode connected with a data line, a second electrode connected with the first node, and a gate electrode which receives a scan signal;
a third transistor including a first electrode connected with the second node, a second electrode connected with a first initialization voltage line which supplies a first initialization voltage, and a gate electrode which receives a first compensation scan signal;
a fourth transistor including a first electrode connected with the second electrode of the second transistor, a second electrode connected with the first node, and a gate electrode which receives a second compensation scan signal; and a fifth transistor including a first electrode connected with the first voltage line, a second electrode connected with each of the second electrode of the second transistor and the first electrode of the fourth transistor, and a gate electrode which receives a first light emitting signal, and wherein the third transistor and the fourth transistor are N-type transistors, and the first transistor, the second transistor and the fifth transistor are P-type transistors.

20. The electronic device of claim 19, further comprising:

a sixth transistor including a first electrode connected with the first electrode of the first transistor, a second electrode connected with a bias voltage line which supplies a bias voltage, and a gate electrode which receives the scan signal; and a seventh transistor including a first electrode connected with a second initialization voltage line which supplies a second initialization voltage, a second electrode connected with the first electrode of the light emitting diode, and a gate electrode which receives the scan signal.

* * * * *